(12) United States Patent
Wang et al.

(10) Patent No.: US 6,518,085 B1
(45) Date of Patent: Feb. 11, 2003

(54) METHOD FOR MAKING SPECTRALLY EFFICIENT PHOTODIODE STRUCTURES FOR CMOS COLOR IMAGERS

(75) Inventors: Ching-Chun Wang, Kaohsinng (TW); Dun-Nian Yaung, Taipei (TW); Chien-Hsien Tseng, Hsinchu (TW); Shou-Gwo Wuu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 85 days.

(21) Appl. No.: 09/635,584

(22) Filed: Aug. 9, 2000

(51) Int. Cl.[7] .................... H01L 21/00; H01L 29/76; H01L 29/94; H01L 31/062
(52) U.S. Cl. ................ 438/70; 438/73; 257/440
(58) Field of Search ................ 257/291, 292, 257/233, 440, 461, 462, 464; 438/48, 309

(56) References Cited

U.S. PATENT DOCUMENTS

| | | | |
|---|---|---|---|
| 5,122,850 A | 6/1992 | Burkey | 357/24 |
| 5,514,620 A | 5/1996 | Aoki et al. | 437/160 |
| 5,965,875 A | 10/1999 | Merrill | 250/226 |
| 6,023,081 A | 2/2000 | Drowley et al. | 257/292 |
| 6,040,593 A | 3/2000 | Park | 257/292 |
| 6,051,447 A * | 4/2000 | Lee et al. | 257/233 |
| 6,339,248 B1 * | 1/2002 | Zhao et al. | 257/233 |
| 6,353,240 B2 * | 3/2002 | Chien et al. | 257/233 |
| 6,365,887 B1 * | 4/2002 | Fujimoto et al. | 250/208.1 |

FOREIGN PATENT DOCUMENTS

| | | | | |
|---|---|---|---|---|
| JP | 361049464 A | * | 3/1986 | 257/440 |
| JP | 403091959 A | * | 4/1991 | 257/458 |

* cited by examiner

Primary Examiner—Tom Thomas
Assistant Examiner—Samuel A Gebremariam
(74) Attorney, Agent, or Firm—George O. Saile; Stephen B. Ackerman

(57) ABSTRACT

A method for making an array of photodiodes with more uniform optical spectral response for the red, green, and blue pixel cells on a CMOS color imager is achieved. After forming a field oxide on a substrate to electrically isolate device areas for CMOS circuits, an array of deep N doped wells is formed for photodiodes for the long wavelength red pixel cells. An array of P doped well regions is formed adjacent to and interlaced with the N doped wells. Shallow diffused $N^+$ regions are formed within the P doped wells for the shorter wavelength green and blue color pixels cells. The shallow diffused photodiodes improve the quantum efficiency (QE), and provide a color imager with improved color fidelity. An insulating layer and appropriate dye materials are deposited and patterned over the photodiodes to provide the array of color pixel cells. The N and P doped wells are also used for the supporting FET CMOS circuits to provide a cost-effective manufacturing process.

17 Claims, 5 Drawing Sheets

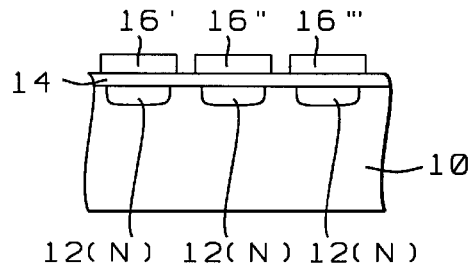
FIG. 1 — Prior Art
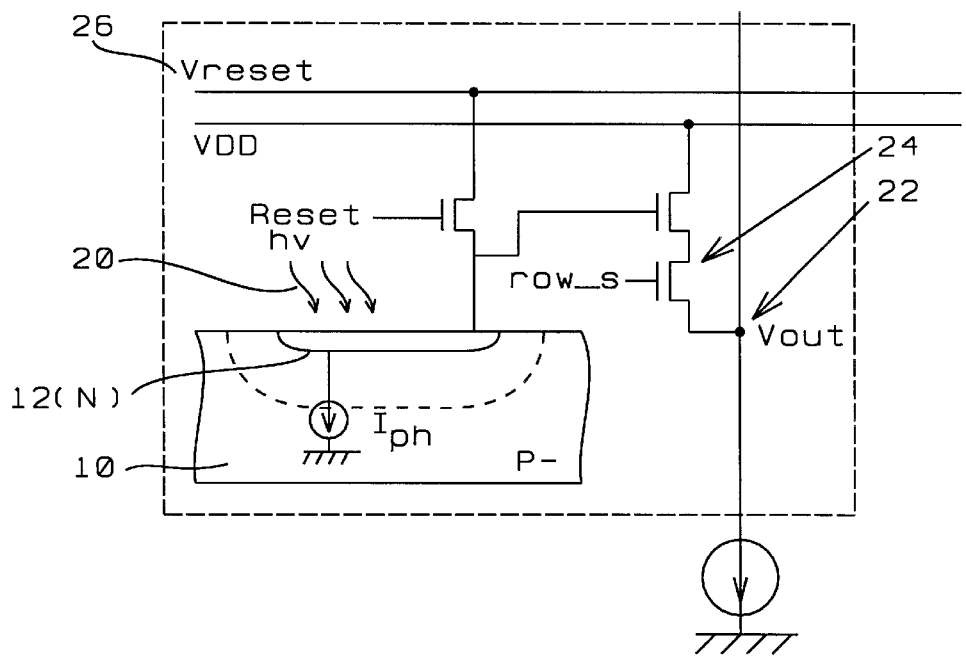
FIG. 2A — Prior Art
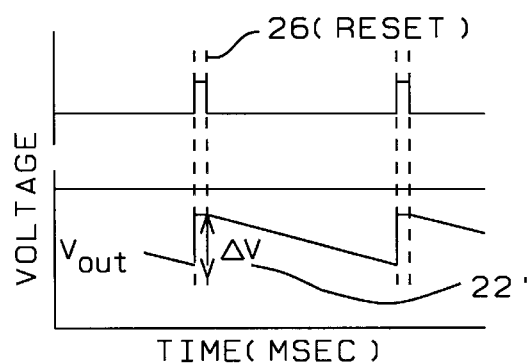
FIG. 2B — Prior Art

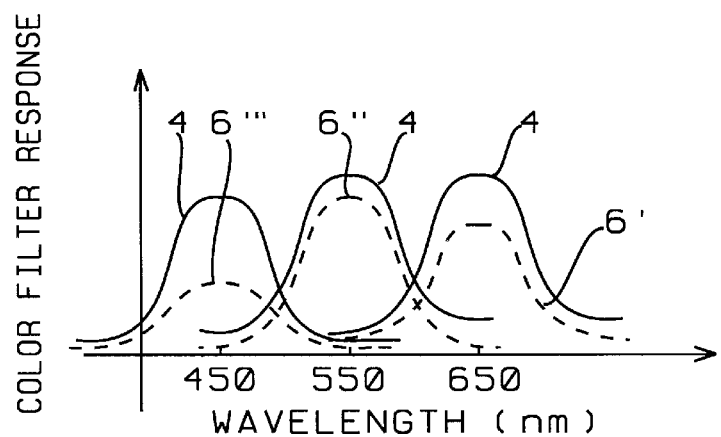
FIG. 3A – Prior Art
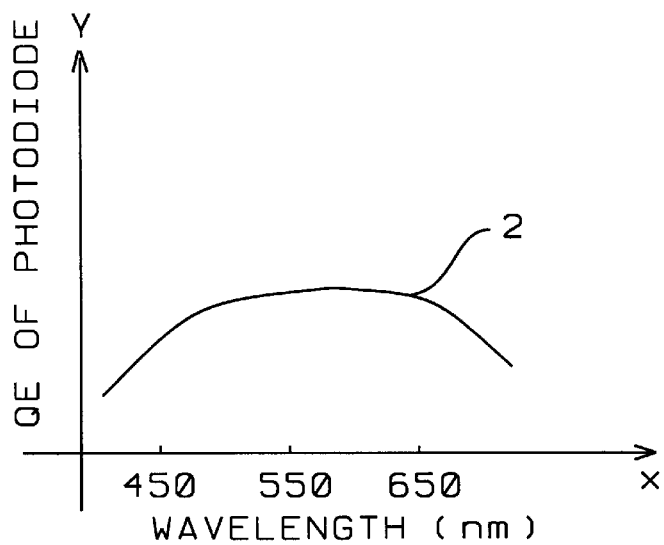
FIG. 3B – Prior Art
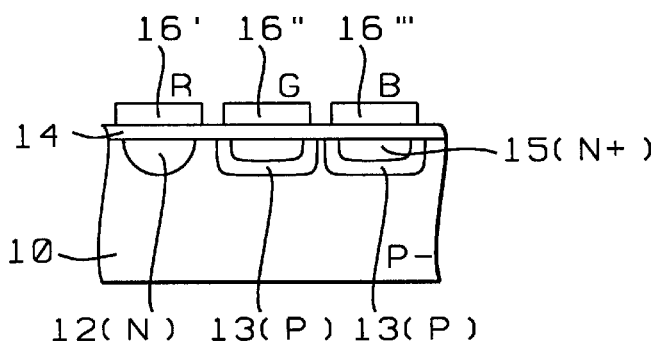
FIG. 4 ical imager on a semiconductor substrate using CMOS technology, and more particularly relates to a method for making photodiodes with improved (more uniform) spectral response across the frequency band for the red, green, and blue (wavelength) pixel cells in the array of photodiodes.

METHOD FOR MAKING SPECTRALLY EFFICIENT PHOTODIODE STRUCTURES FOR CMOS COLOR IMAGERS

BACKGROUND OF THE INVENTION (1) Field of the Invention

The present invention relates to the fabrication of a CMOS color imager on a semiconductor substrate using CMOS technology, and more particularly relates to a method for making photodiodes with improved (more uniform) spectral response across the frequency band for the red, green, and blue (wavelength) pixel cells in the array of photodiodes.

(2) Description of the Prior Art

In camcorders and early digital cameras, charge coupled devices (CCDs) were used as optical detectors for detecting and processing color images. The CCDs detect the light on an array of photosites on the surface of an image sensor, and then the induced charge at each site in a row of the array of photosites is sequentially transferred to a readout register where it is detected, amplified, and processed through an analog/digital converter and stored as digital information for further processing. Although the CCD is a convenient device for photoimaging, it is not as economically practical as the CMOS image sensor for integrating other (camera) circuit functions on the same sensor chip for image processing. Since the CMOS technology is more advanced because of its extensive use in computers for logic functions, such as central processing units (CPUs) and for data storage and the like, the CMOS technology is the technology of choice for color sensors in future digital cameras. The CMOS technology allows more function to be integrated directly on the sensor chip. Therefore fewer CMOS chips are required than for the CCD technology, and the CMOS color imager is more manufacturing cost effective.

To better understand the limitations of the present CMOS color imager technology, a portion of a CMOS color imager, having photodiodes for the primary color pixels for red, green, and blue (R/G/B) wavelengths, is depicted in the schematic cross-sectional view of FIG. 1. In the conventional process, a single diffused photodiode is typically used for each of the colored (R/G/B) pixels. These photodiodes are formed in the substrate 10 by forming N doped wells 12, one for each color pixel, in an array of pixels. FIG. 2A shows one of the CMOS circuits associated with each photodiode, commonly referred to as an active photodiode circuit. The function of the circuit is to sample the change in output voltage (delta $V_{out}$) on the photodiode at the output node 22 that is a function of the light intensity (number of photons nhv) impinging on the surface of the diode 12. Briefly, the photodiodes 12, one of which is shown in FIG. 2A, are reversed biased and the diodes are charged to a reset voltage $V_{reset}$. When an optical image is impressed on the photodiodes, the light intensity is measured as the number n of photons (having energy=hv) 20 generating the photocurrent $I_{ph}$ and charging the diode 12. The h is Planck's constant. The v is the frequency of the light, and is related to wavelength lamda by lamda=c/v, where c is the speed of light. The diode 12 is then interrogated using the row select (row_s) gate 24 to determine the change in voltage delta V at the output voltage $V_{out}$, which is proportional to the light intensity or energy nhv. In FIG. 2B this delta V is depicted as the change in $V_{out}$ in the chart for voltage vs. time, where the vertical axis is a measure of the change in voltage (delta voltage) and the horizontal axis is time in milliseconds. The reset voltage $V_{reset}$ 26 waveform is shown offset above the plot of the change in output voltage (delta $V_{out}$) 22' also plotted in FIG. 2B. After interrogating the array of photodiodes (pixels) and processing and storing the digital data, the active photodiode circuit is then reset for recording the next optical image. The primary colors (R,G,B) in the image imposed on the CMOS image sensor are determined by using a separate diode for each of the color pixels. This is achieved by using color filters (or dyes), that is red, green, and blue (R/G/B) filter 16', 16", and 16''', respectively, over each of the three diodes, as depicted in FIG. 1.

The color filter response curve for the photodiodes 12 with the three color filters 16' (red), 16" (green), and 16''' (blue) of FIG. 1 used to detect the color image is depicted in FIG. 3A. The color filter response is also shown in arbitrary units. The ideal or preferred response profile is shown as the solid curves 4, and the actual response profile for a conventional photodiode 12 is depicted by the dashed curves 6', 6", and 6''', respectively, for the red, green, and blue pixel cells 16', 16", and 16''' of FIG. 1. It is clearly seen that the color filter response is substantially reduced at the shorter wavelength blue pixel cells 6''' at a wavelength of 450 nm. This results in poor color fidelity of the original color image. This poor color fidelity is a result of the nonuniform quantum efficiency (QE) across the optical waveband from 450 to 650 nm. This variation in QE is depicted by the curve 2 in FIG. 3B, where the y-axis is the QE (the ratio of the number of photoelectrons to the number of photons) measured in arbitrary units, and the x-axis is the wavelength of the light in nm.

Several methods of forming photodiodes for CMOS color imagers have been reported in the literature. For example, Drowley et al., U.S. Pat. No. 6,023,081, describe a semiconductor image sensor in which the red and blue pixels are made in the same type of well area (N well). The blue and red pixels are made after forming the FET gate electrodes. In U.S. Pat. No. 5,965,875 to Merrill a triple diffused well structure is used to separate out and to detect and measure the intensity of the three primary colors red, green, and blue. The method is based on the principle that the absorption length of the light in silicon is a function of the different frequencies. U.S. Pat. No. 6,040,593 to Park et al. describes a method for making a buried diffused photodiode structure with a self-aligned silicide layer for making CMOS image sensors. U.S. Pat. No. 5,122,850 to Burkey describes a method for making CCD image sensors, which include P-stripes (diffused regions) under the transfer gate of the CCD devices and adjacent to but not touching the photodiode which provides effective anti-blooming control while effectively transferring the photocharge to the CCD. U.S. Pat. No. 5,514,620 to Aoki et al. describes a method of using solid state diffusion for making shallow PN junction devices that include photo-electric conversion devices.

However, there is still a strong need in the digital imaging industry to provide photodiodes for color imagers with a more uniform spectral response curve (QE) across the optical spectral range for red, green, and blue pixels (photodiodes).

SUMMARY OF THE INVENTION

A principal object of this invention is to provide photodiodes for color imagers with a more uniform spectral response (QE) for the red, green, and blue (R/G/B) pixels for better color fidelity.

It is another object of this invention to improve the spectral response by varying the individual junction depths of the diffused photodiodes for the R/G/B pixels to provide a more uniform spectral response curve for the optical bandwidth.

Still another object of this invention is to form this more uniform spectral response curve by forming deep photodiode diffused (metallurgical) junctions for the longer wavelength red pixels, and shallower diffused photodiode junctions for the shorter wavelength green and blue pixels.

A further object of this invention is to provide a process that is compatible with the standard CMOS processes to form CMOS color imagers for a more cost-effective manufacturing process.

In accordance with the above objects, a method for fabricating photodiodes for CMOS color imagers with a more uniform spectral response for the red, green, and blue pixel cells is now described. The method utilizes photodiodes with different diffused junction depths to modify the quantum efficiency (QE) of the photodiodes. The method can be used with existing CMOS process technology, and therefore the CMOS color imager can include additional signal processing circuits integrated into the existing CMOS imager to reduce cost.

The method for forming these photodiodes for CMOS color imagers begins by providing a semiconductor substrate consisting of a $P^-$ doped single-crystal silicon. Each CMOS color imager (chip) formed on the substrate consists of device areas for CMOS circuits and optical device areas for an array of photodiodes for the alternating red, green, and blue pixel cells. Typically the device areas are surrounded and electrically isolated by field oxide areas. An array of N doped wells is formed, for example, by implanting phosphorus ions ($P^{31}$) in the optical device areas for the photodiodes in the red pixel cells. An array of P doped wells is formed adjacent to the N doped wells, for example, by ion implanting boron ions ($B^{11}$). A key feature of this invention is to form shallow doped $N^+$ regions in the P doped wells, for example, by implanting arsenic ions ($As^{75}$). Since the photon absorption depth in the silicon is a function of the photon wavelength, the shorter wavelength green and blue light has a shallower absorption depth. The absorption of the blue photons in the shallower $N^+$ doped photodiodes results in enhanced photocurrent $I_{ph}$ and in improved quantum efficiency. The shallow diffused $N^+$ doped photodiodes formed in the P doped wells are then used to make the green and blue pixel cells. Dye materials are deposited for the red, green, and blue filters. The individual dye materials are patterned to form appropriate optical filters over the red, green, and blue pixel cells thereby completing the photodiodes for the CMOS color imager.

BRIEF DESCRIPTION OF THE DRAWINGS

The objects and other advantages of the invention will become more apparent in the preferred embodiment when read in conjunction with the following drawings.

FIG. 1 shows a schematic cross-sectional view of a portion of a CMOS color imager through three photodiodes used to form the red, green, and blue pixel cells for a conventional imager of the prior art.

FIG. 2A shows a schematic circuit for a conventional (prior art) active photodiode circuit associated with each photodiode.

FIG. 2B is a graph of the photodiode voltage as a function of time showing the reset voltage $V_{reset}$ and the change in the output voltage (delta V) as a result of the photocurrent $I_{ph}$ induced by impinging photon energy (nhv) during the imaging for the circuit of FIG. 2A.

FIG. 3A shows a plot of the color filter response for the conventional (prior art) photodiodes as a function of the blue, green, and red wavelengths of 450, 550, and 650 nm, respectively.

FIG. 3B shows a graph of the quantum efficiency (QE) as a function of the optical wavelength for the conventional photodiodes of the prior art.

FIG. 4 shows a schematic cross-sectional view of a portion of a CMOS color imager through three photodiodes used to form the red, green, and blue pixel cells, by the method of this invention, with photodiodes having varying diffused junction depths.

DESCRIPTION OF THE PREFERRED EMBODIMENT

Figure 5:
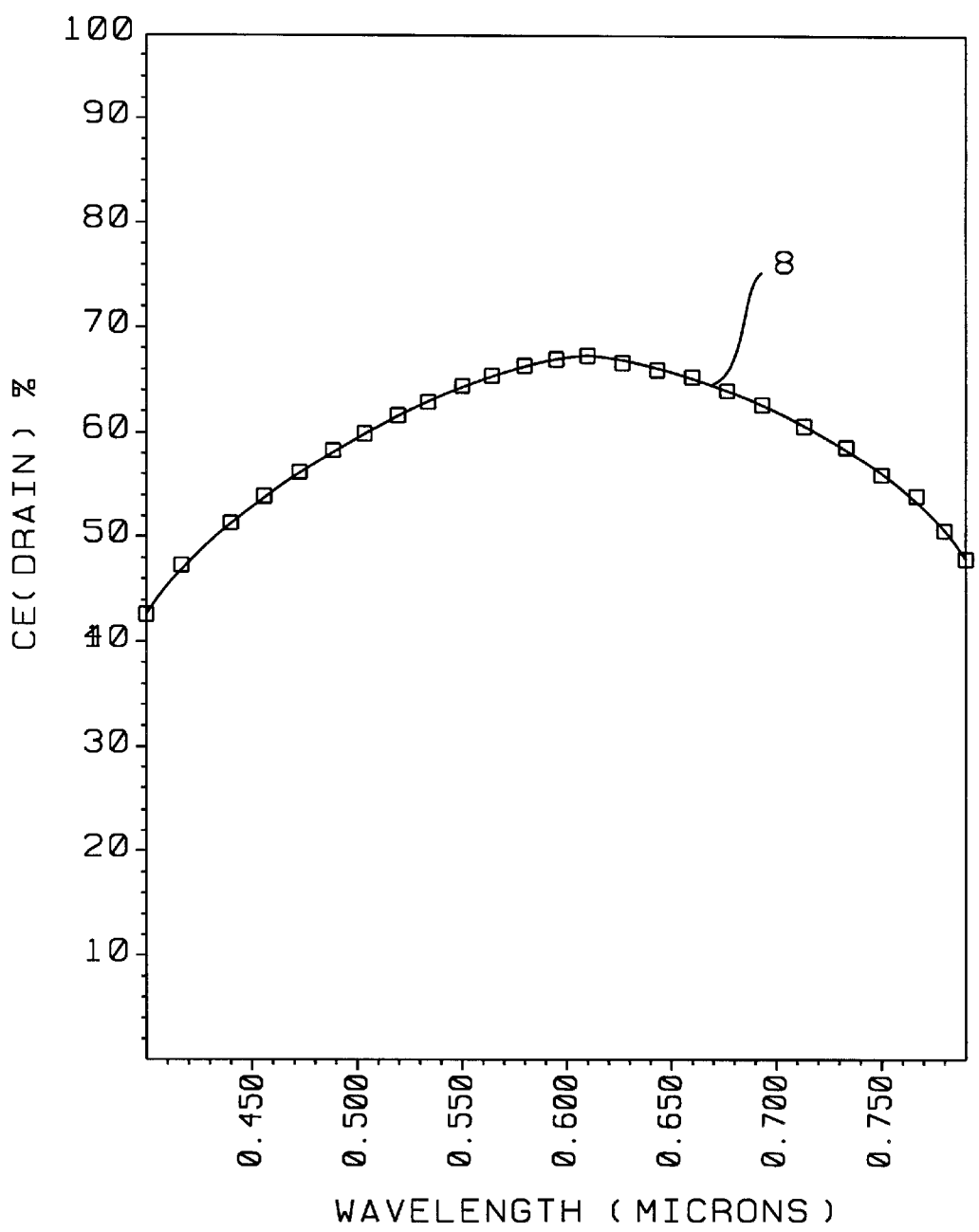
FIG. 5 shows a graph of the simulated quantum efficiency as a function of optical wavelength for the photodiodes with the deep diffused junctions.

In accordance with the objects of this invention, a method for making spectrally efficient photodiodes with more uniform spectral response for color imagers is now described in detail. Although the fabrication of the $P^-$ and N-channel FETs are not described in detail, it should be understood that these novel photodiodes are integrated into the sensor circuit using some of the same FET process steps to reduce process cost. For example, the N doped and P doped wells in the CMOS circuits are also used in fabricating the photodiodes with a more uniform spectral response.

Referring to FIG. 4, a schematic cross section through a portion of a color imager is shown. The cross section is through photodiodes for only three color pixels of the array of pixels in the color imager. The photodiodes are formed in a semiconductor substrate 10. The substrate 10 is typically a P doped single-crystal silicon having a <100>crystallographic orientation. Prior to forming the photodiodes, a field oxide is formed on and in the substrate to electrically isolate device areas for the CMOS circuits. However, the field oxide is not relevant to understanding the invention, and therefore is not explicitly shown in the figures to simplify the drawings and the discussion.

Referring still to FIG. 4, an array of N doped wells 12(N) for the photodiodes of the red pixels cells is formed in the $P^-$ substrate 10. Only one of the N doped wells 12(N) is depicted in FIG. 4. The N doped wells are formed by using a patterned photoresist implant mask and implanting phosphorus ions ($P^{31}$). The $P^{31}$ ions are implanted and the substrate is annealed during subsequent processing to provide a final dopant concentration of between about 1.0 E 16 and 1.0 E 18 atoms/cm$^3$. The N doped wells are implanted to have a preferred depth for the diffused junction (metallurgical junctions where the N dopant concentration= $P^-$ dopant concentration) of between about 0.5 and 1.0 micrometers.

Still referring to FIG. 4, an array of P doped wells 13(P) is formed adjacent to the N doped wells 12(N) in which the photodiodes for the green and blue pixel cells are formed. The P doped wells 13 are formed by using a photoresist implant mask and implanting boron ($B^{11}$) to have a final dopant concentration of between about 1.0 E 16 and 1.0 E 18 atoms/cm$^3$. The preferred depth of the diffused P doped wells is between about 0.5 and 1.0 micrometers. These N and P doped wells can also serve as the wells for the P and N channel FETs of the CMOS circuits.

Still referring to FIG. 4, and a key feature of this invention, shallow diffused N$^+$ doped regions 15(N$^+$) are formed in the P doped wells 13(P). The shallow doped regions 15(N$^+$) are formed by using a photoresist implant mask and implanting arsenic ions ($As^{75}$). The preferred final dopant concentration of the arsenic is between about 1.0 E 20 and 1.0 E 21 atoms/cm$^3$, and the metallurgical junction is at a depth of between about 0.05 and 0.1 micrometers in the P doped wells 13(P).

Continuing with FIG. 4, an insulating layer 14 is deposited on the array of photodiodes 12(N) and 15(N$^+$). The insulating layer is preferably an undoped silicon oxide ($SiO_2$) and is deposited by chemical vapor deposition. The $SiO_2$ is deposited to a thickness of between about 3000 and 5000 Angstroms.

Also as shown in FIG. 4, the photodiode portion of the CMOS color imager is completed by depositing and patterning a dye material for each of the R/G/B color pixels to form the red, green, and blue color optical filters 16', 16", and 16'". For example, each of the dye materials can be deposited by spin coating to form a film, as commonly practiced in the industry, and the dye materials are patterned using conventional photolithographic techniques and etching.

EXAMPLE

Figure 6:
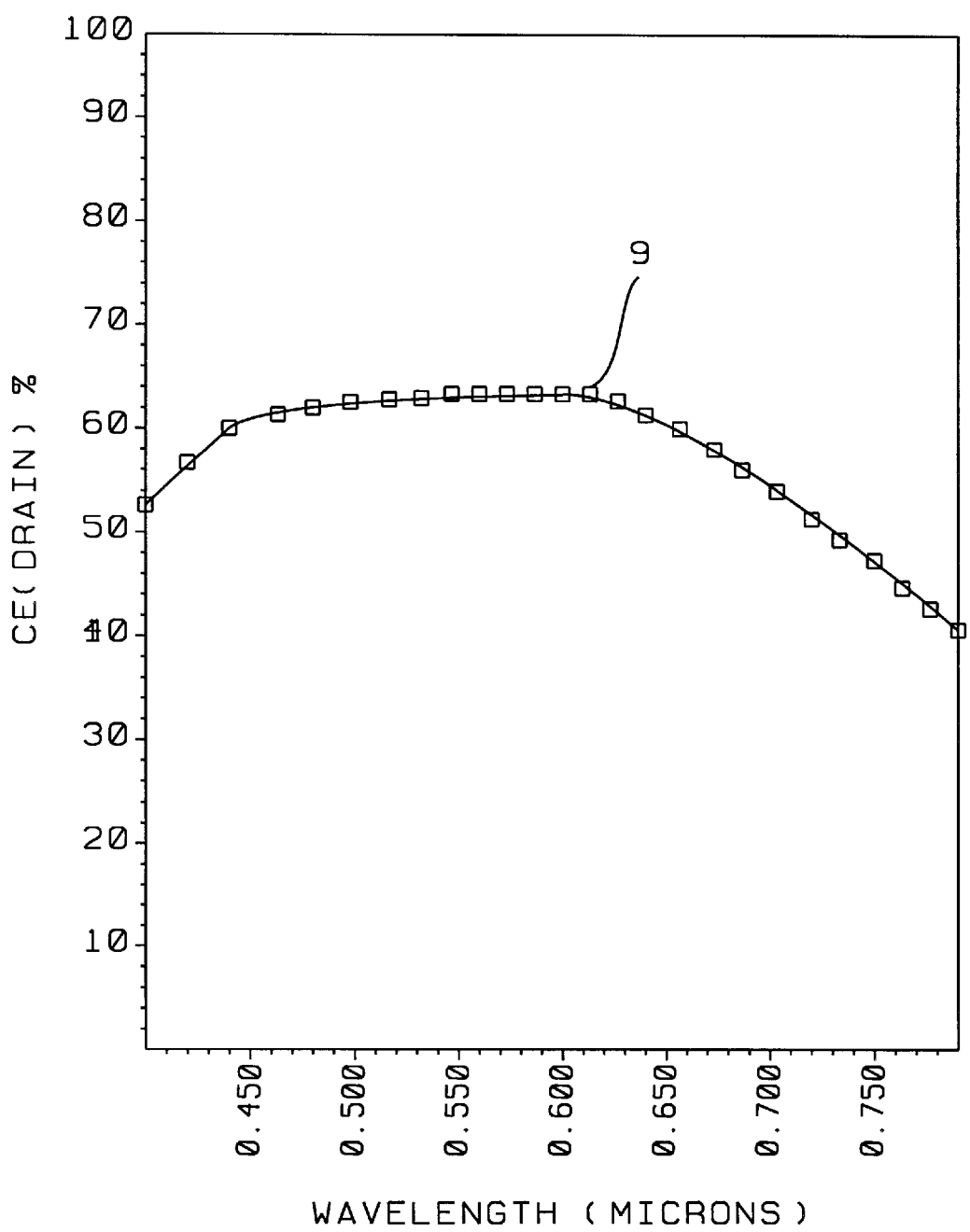
FIG. 6 shows a graph of the simulated quantum efficiency as a function of optical wavelength for the photodiodes with the shallow diffused $N^+$ junctions in the P doped wells.

To better appreciate the invention for making these photodiodes with improved uniformity across the spectral range, the quantum efficiency (QE) of these photodiodes was determined as a function of optical wavelength. The QE was determined by simulating the collector efficiency as a function of optical wavelength for the N well photodiodes 12(N) and the N$^+$ photodiodes 15(N$^+$) formed in the P wells 13(P) for the photodiodes depicted in FIG. 4. The QE was simulated using a Medici simulation program provided by Avanti Corp. of U.S.A. FIG. 5 shows a plot of a curve 8 for the collector efficiency vs. the optical wavelength in micrometers for the deep N well red photodiode 12(N). As depicted in FIG. 5, the QE is about maximum (60%) at the long wavelength (650 um) for the red light, and the QE drops off dramatically to about 50% at the shorter wavelengths (450 um) for the blue light. FIG. 6 shows a plot of a curve 9 for the collector efficiency vs. the optical wavelength in micrometers for the shallow N$^+$ doped green and blue photodiode 15(N$^+$) in the P well. As depicted in FIG. 6, the QE is about maximum (60%) at the short wavelength (450 um) for the blue light, and the QE remains essentially constant for the longer wavelength (550 um) for the green light. FIG. 7B depicts a plot of curves 8 and 9 (from FIGS. 5 and 6, respectively) superimposed in the same graph to illustrate the improved spectral uniformity using a CMOS color imager having the two photodiodes, namely the deep N well diode 12(N) and the shallow N$^+$ diode 15(N$^+$) shown in FIG. 4. The QE is plotted as a function of optical wavelength in nanometers (nm).

Figure 7A:
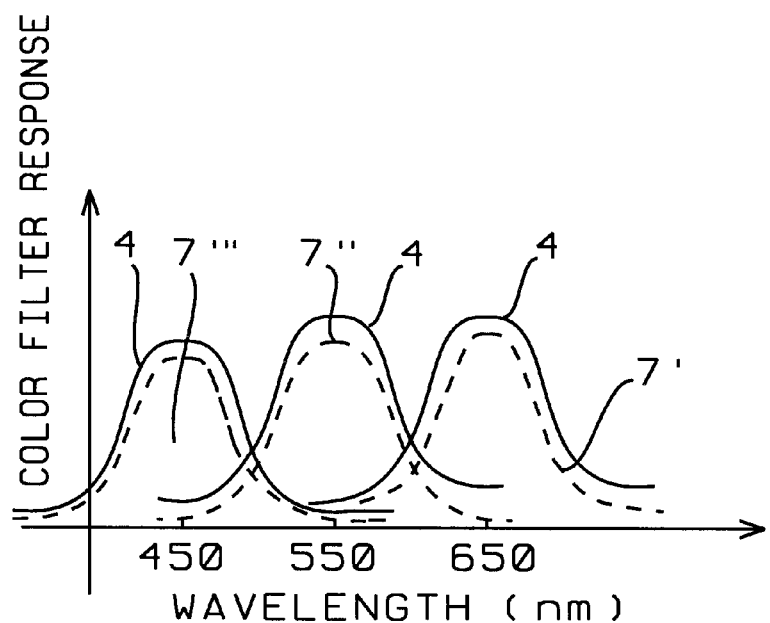
FIG. 7A shows a plot of the color filter response for the improved photodiodes of this invention as a function of the blue, green, and red wavelengths of 450, 550, and 650 nm, respectively.
Figure 7B:
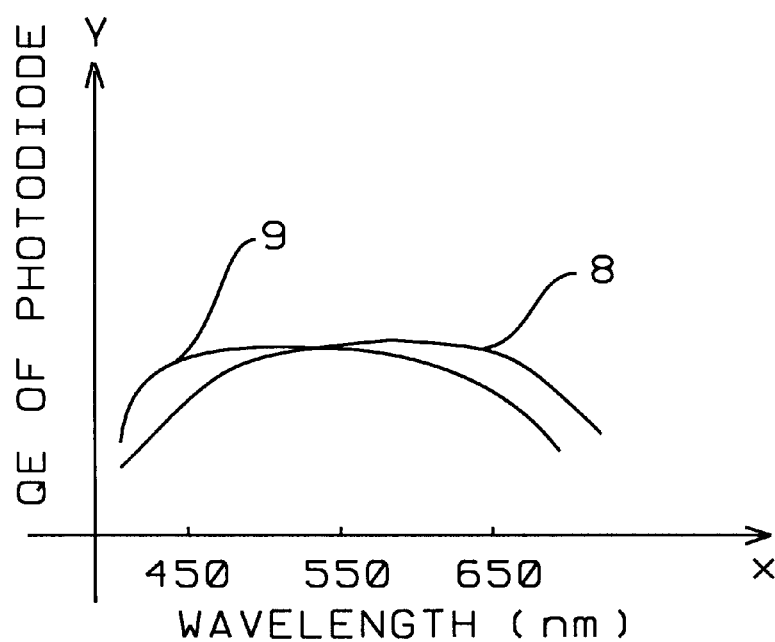
FIG. 7B shows a graph of the improved QE as a function of the optical wavelength for both the shallow and deep diffused photodiodes of this invention.

This improved spectral response is also depicted in FIG. 7A for the red, green, and blue wavelengths (450, 550, 650 nm, respectively) using color filters over the appropriate photodiodes. The color filter response for the three wavelengths is depicted by the dashed curves. 7', 7", and 7'" for the red, green, and blue pixel cells, respectively, vs. the ideal curves (solid curves) 4. The color filter response curve for the short wavelength blue light (450 nm) using the shallow N$^+$ diffused photodiode is substantially increased compared to the response curve 6 in FIG. 3A of the prior art. This provides a CMOS color imager with a much improved (uniform) color filter response curve for the red, green, and blue color pixel cells.

While the invention has been particularly shown and described with reference to the preferred embodiment thereof, it will be understood by those skilled in the art that various changes in form and details may be made without departing from the spirit and scope of the invention.

What is claimed is:

1. A method for making spectrally efficient photodiodes for CMOS color imagers comprising the steps of:

providing a P$^-$ doped semiconductor substrate having device areas for CMOS circuits, and having optical device areas for an array of photodiodes for alternating red, green, and blue pixel cells;

forming an array of N doped regions having various junction depths and dopant concentrations for said red, green, and blue pixel cells to provide an essentially constant quantum efficiency between said pixel cells;

depositing dye materials and patterning to form appropriate optical filters over said red, green, and blue pixel cells thereby completing said photodiodes for said CMOS color imagers.

2. The method of claim 1, wherein said semiconductor substrate is single-crystal silicon doped with boron to a concentration of between 1.0 E 14 and 1.0 E 16 atoms/cm$^3$.

3. The method of claim 1, wherein said N doped regions for said red pixel cells are formed by implanting phosphorus ions to provide a final concentration of between 1.0 E 16 and 1.0 E 18 atoms/cm$^3$ and to a junction depth of between about 0.5 and 1.0 micrometers.

4. The method of claim 1, wherein said N doped regions for said green pixel cells are formed by implanting phosphorus ions to provide a final concentration of between 1.0 E 20 and 1.0 E 21 atoms/cm$^3$ and to a junction depth of between about 0.05 and 0.1 micrometers.

5. The method of claim 1, wherein said N doped regions for said blue pixel cells are formed by implanting phosphorus ions to provide a final concentration of between 1.0 E 20 and 1.0 E 21 atoms/cm$^3$ and to a junction depth of between about 0.05 and 0.1 micrometers.

6. The method of claim 1, wherein said dye materials are deposited by spin coating.

7. The method of claim 1, wherein said dye materials are patterned using photolithography and etching.

8. A method for making spectrally efficient photodiodes for CMOS color imagers comprising the steps of:

providing a P$^-$ doped semiconductor substrate having device areas for CMOS circuits, and having optical device areas for an array of photodiodes for alternating red, green, and blue pixel cells;

forming an array of N doped wells in said optical device areas for said photodiodes in said red pixel cells;

forming an array of P doped wells;

forming N$^+$ doped regions in said P doped wells, wherein said N$^+$ doped regions are shallower than said N doped wells for said red pixel cells, thereby forming said photodiodes in said green and said blue pixel cells;

depositing dye materials and patterning to form appropriate optical filters over said red, green, and blue pixel cells thereby completing said photodiodes for said CMOS color imagers.

9. The method of claim 8, wherein said semiconductor substrate is single-crystal silicon doped with boron to a concentration of between 1.0 E 14 and 1.0 E 16 atoms/cm$^3$.

10. The method of claim 8, wherein said N doped wells are formed by implanting phosphorus ions to provide a final concentration of between 1.0 E 16 and 1.0 E 18 atoms/cm$^3$.

11. The method of claim 8, wherein said N doped wells are formed to have a metallurgical junction depth of between about 0.5 and 1.0 micrometers.

12. The method of claim 8, wherein said P doped wells are formed by implanting boron ions to provide a final concentration of between 1.0 E 16 and 1.0 E 18 atoms/cm$^3$.

13. The method of claim 8, wherein said P doped wells are formed to have a metallurgical junction depth of between about 0.05 and 0.1 micrometers.

14. The method of claim 8, wherein said N$^+$ doped regions in said P doped wells are doped with arsenic ions to provide a final dopant concentration of between 1.0 E 20 and 1.0 E 21 atoms/cm$^3$.

15. The method of claim 8, wherein said N$^+$ doped regions in said P doped wells are doped to have a metallurgical junction depth of between about 0.05 and 0.1 micrometers.

16. The method of claim 8, wherein said dye materials are deposited by spin coating.

17. The method of claim 8, wherein said dye materials are patterned using photolithography and etching.

* * * * *

UNITED STATES PATENT AND TRADEMARK OFFICE
CERTIFICATE OF CORRECTION

PATENT NO.     : 6,518,085 B1                                              Page 1 of 1
DATED          : February 11, 2003
INVENTOR(S)    : Ching-Chun Wang et al.

It is certified that error appears in the above-identified patent and that said Letters Patent is hereby corrected as shown below:

<u>Title page,</u>
Item [75], delete "Ching-Chun Wang, Kaohsinng (TW)", and replace with -- Ching-Chun Wang, Kaohsiung (TW) --.

Signed and Sealed this

Twenty-eighth Day of October, 2003

JAMES E. ROGAN
*Director of the United States Patent and Trademark Office*